United States Patent
Dadvand et al.

(10) Patent No.: US 10,453,817 B1
(45) Date of Patent: Oct. 22, 2019

(54) ZINC-COBALT BARRIER FOR INTERFACE IN SOLDER BOND APPLICATIONS

(71) Applicant: Texas Instruments Incorporated, Dallas, TX (US)

(72) Inventors: Nazila Dadvand, Richardson, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/011,283

(22) Filed: Jun. 18, 2018

(51) Int. Cl.
| | |
|---|---|
| H01L 23/00 | (2006.01) |
| H01L 23/495 | (2006.01) |
| B23K 1/00 | (2006.01) |
| C25D 7/12 | (2006.01) |
| C25D 3/22 | (2006.01) |
| B23K 101/36 | (2006.01) |
| C25D 3/12 | (2006.01) |

(52) U.S. Cl.
CPC ............ *H01L 24/13* (2013.01); *B23K 1/0016* (2013.01); *C25D 7/12* (2013.01); *H01L 23/4951* (2013.01); *H01L 23/49582* (2013.01); *H01L 24/11* (2013.01); *B23K 2101/36* (2018.08); *C25D 3/12* (2013.01); *C25D 3/22* (2013.01); *H01L 2224/11462* (2013.01); *H01L 2224/13082* (2013.01); *H01L 2224/13118* (2013.01); *H01L 2224/13147* (2013.01); *H01L 2224/13155* (2013.01); *H01L 2224/13157* (2013.01)

(58) Field of Classification Search
CPC . H01L 2224/13118; H01L 2224/13157; H01L 2224/13155; H01L 2224/13564; H01L 2224/13618; H01L 2224/13657; H01L 2225/1058; H01L 23/49513; H01L 23/49582

See application file for complete search history.

(56) References Cited

U.S. PATENT DOCUMENTS

| | | | | |
|---|---|---|---|---|
| 1,361,339 | A * | 12/1920 | Knoblock | F21L 19/00 248/309.2 |
| 1,405,573 | A * | 2/1922 | Elliott | A01M 5/04 43/140 |
| 6,203,931 | B1 * | 3/2001 | Chu | B32B 15/018 257/E23.054 |
| 6,287,896 | B1 * | 9/2001 | Yeh | H01L 23/49582 257/E23.054 |
| 6,818,545 | B2 * | 11/2004 | Lee | H01L 24/05 257/E21.508 |
| 6,917,119 | B2 * | 7/2005 | Lee | H01L 21/563 257/737 |

(Continued)

*Primary Examiner* — David A Zarneke
(74) *Attorney, Agent, or Firm* — Dawn Jos; Charles A. Brill; Frank D. Cimino

(57) ABSTRACT

A microelectronic device has bump bond structures on input/output (I/O) pads. The bump bond structures include copper-containing pillars, a barrier layer including cobalt and zinc on the copper-containing pillars, and tin-containing solder on the barrier layer. The barrier layer includes 0.1 weight percent to 50 weight percent cobalt and an amount of zinc equivalent to a layer of pure zinc 0.05 microns to 0.5 microns thick. A lead frame has a copper-containing member with a similar barrier layer in an area for a solder joint. Methods of forming the microelectronic device are disclosed.

20 Claims, 13 Drawing Sheets

(56) References Cited

U.S. PATENT DOCUMENTS

| | | | |
|---|---|---|---|
| 8,836,146 B2* | 9/2014 | Chou | H01L 23/3157 257/780 |
| 8,922,004 B2* | 12/2014 | Lin | H01L 24/11 257/737 |
| 9,093,314 B2* | 7/2015 | Lin | H01L 24/11 |
| 9,190,348 B2* | 11/2015 | Chen | H01L 23/485 |
| 9,219,016 B2* | 12/2015 | Lin | H01L 22/32 |
| 9,472,521 B2* | 10/2016 | Chuang | H01L 24/05 |
| 9,496,238 B2 | 11/2016 | Shu et al. | |
| 9,646,945 B2* | 5/2017 | Kim | H01L 24/13 |
| 2001/0040290 A1* | 11/2001 | Sakurai | H01L 23/3128 257/737 |
| 2002/0192492 A1* | 12/2002 | Abys | C23C 26/00 428/647 |
| 2005/0048772 A1* | 3/2005 | Pan | H01L 23/53238 438/672 |
| 2005/0048798 A1* | 3/2005 | Bojkov | C23F 1/18 438/784 |
| 2005/0073048 A1* | 4/2005 | Bojkov | H01L 24/05 257/737 |
| 2005/0106408 A1* | 5/2005 | Chen | C23C 2/02 428/629 |
| 2005/0249969 A1* | 11/2005 | Xu | B32B 15/01 428/647 |
| 2010/0084765 A1* | 4/2010 | Lee | H01L 24/13 257/738 |
| 2012/0299197 A1* | 11/2012 | Kwon | H01L 23/49816 257/777 |
| 2013/0001599 A1* | 1/2013 | Lee | H01L 25/167 257/88 |
| 2013/0077272 A1* | 3/2013 | Lin | H01L 22/32 361/760 |
| 2013/0320524 A1* | 12/2013 | Chuang | H01L 24/05 257/737 |
| 2014/0291838 A1* | 10/2014 | Chen | H01L 23/485 257/737 |
| 2015/0099316 A1* | 4/2015 | Ryu | B23K 1/20 438/26 |
| 2016/0027751 A1* | 1/2016 | Kim | H01L 24/13 257/737 |
| 2016/0240503 A1 | 8/2016 | Shu et al. | |
| 2017/0102520 A1* | 4/2017 | Chen | G02B 9/60 |
| 2017/0278814 A1* | 9/2017 | Hung | H01L 24/16 |
| 2018/0166420 A1* | 6/2018 | Park | H01L 25/0657 |
| 2019/0103378 A1* | 4/2019 | Escher-Poeppel | H01L 24/83 |

* cited by examiner

ZINC-COBALT BARRIER FOR INTERFACE IN SOLDER BOND APPLICATIONS

FIELD OF THE DISCLOSURE

This disclosure relates to the field of microelectronic devices. More particularly, this invention relates to barrier layers in microelectronic devices.

BACKGROUND OF THE DISCLOSURE

Some microelectronic devices have bump bond structures with copper pillars and tin-containing solder on the copper pillars. The solder is reflowed (melted) during a bump bond process which attaches the bump bond structures to leads of a package structure such as a lead frame. When the molten tin-containing solder wets the copper, copper-tin intermetallic compounds form around the interface of the copper pillars and the tin-containing solder. Voids may also form in the copper pillars close to the intermetallic compounds. The intermetallic compounds and the voids adversely influence the solder joint reliability, by degrading the mechanical and electrical properties of the joints.

SUMMARY OF THE DISCLOSURE

The present disclosure introduces a microelectronic device having bump bond structures with copper-containing pillars, a barrier layer including cobalt and zinc on the copper-containing pillars, and tin-containing solder on the barrier layer. The barrier layer includes 0.1 weight percent to 50 weight percent cobalt and an amount of zinc equivalent to a layer of pure zinc 0.05 microns to 0.5 microns thick. Methods of forming the microelectronic device are disclosed.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has input/output (I/O) pads with bump bond structures electrically coupled to the I/O pads. The I/O pads may be bond pads electrically coupled to interconnects of the microelectronic device. The I/O pads may be portions of a redistribution layer (RDL) over the interconnects of the microelectronic device. The term "over" should not be construed as limiting the position or orientation of disclosed elements, but should be used to provide spatial relationship between elements. The I/O pads may be bump pads in bond-over-active (BOAC) structures of the microelectronic device. Other manifestations of the I/O pads are within the scope of this disclosure. The bump bond structures include copper-containing pillars, referred to herein as copper pillars, a barrier layer on at least a portion of the copper pillars, and solder on the barrier layer. The barrier layer includes 0.1 weight percent to 50 weight percent cobalt and an amount of zinc equivalent to a layer of pure zinc 0.05 microns to 0.5 microns thick, and may include other metals, such as nickel. The bump bond structures further include tin-containing solder, such as tin-containing solder, on at least a portion of the barrier layer. The barrier layer is located between the copper pillars and the solder. For the purposes of this disclosure, the barrier layer may be disclosed as being on the copper pillars, which includes being on at least a portion of the copper pillars. Similarly, the solder may be disclosed as being on the barrier layer, which includes being on at least a portion of the barrier layer.

A seed layer may be disposed on the I/O pads, under the bump bond structures. The seed layer includes an electrically conductive material, and is sometimes referred to as an under bump metallization (UBM) layer. For the purposes of this disclosure, if the bump bond structures are described as being "on" the I/O pads, they may be directly on the I/O pads, or intervening elements such as the seed layer may be present. If the bump bond structures are described as being "directly on" the I/O pads, there are no other intentionally disposed intervening elements present.

Figure 1:
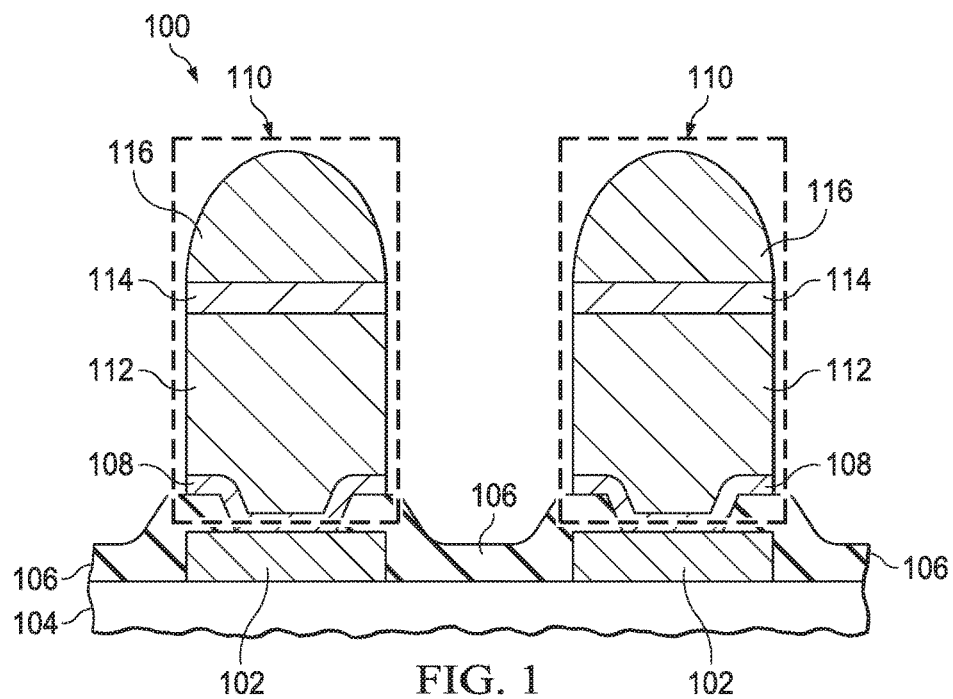
FIG. 1 is a cross section of an example microelectronic device including bump bond structures having a barrier layer which includes cobalt and zinc.

FIG. 1 is a cross section of an example microelectronic device including bump bond structures having a barrier layer which includes cobalt and zinc. The microelectronic device 100 has I/O pads 102 on a substrate 104. The substrate 104 may include, for example, an integrated circuit, a discrete semiconductor device, a microelectrical mechanical systems (MEMS) device, or a multi-chip module. The I/O pads 102 may be manifested, for example, as aluminum pads, copper pads, pad areas of a top-level interconnect layer of the microelectronic device 100, or pad areas of an RDL of the microelectronic device 100. The microelectronic device 100 may include a protective overcoat (PO) layer 106 over the substrate 104. The PO layer 106 may include one or more sublayers of silicon dioxide, silicon nitride, silicon oxynitride, polyimide, or other dielectric material which reduces contamination and mechanical damage of the substrate 104. The PO layer 106, if present, has openings which expose the I/O pads 102, as depicted in FIG. 1

A seed layer 108 may be disposed directly on the I/O pads 102. The seed layer 108 may extend partway onto the PO layer 106 directly adjacent to the openings which expose the I/O pads 102. The seed layer 108 provides an electrically conductive layer for an electroplating operation. The seed layer 108 may include, for example, an adhesion sublayer of titanium, chromium, or nickel. The seed layer 108 may include a top sublayer of copper or nickel to facilitate electroplating copper onto the seed layer 108.

The microelectronic device 100 has bump bond structures 110 directly on the seed layer 108 over the I/O pads 102, so that the bump bond structures 110 are electrically coupled to the I/O pads 102 through the seed layer 108. Each bump bond structure 110 includes a copper pillar 112 on the seed layer 108. The copper pillars 112 include primarily copper, that is, at least 90 weight percent copper. In some versions of the instant example, the copper pillars 112 may be substantially all copper, with trace amounts of other materials resulting from an electroplating operation used to form the copper pillars 112.

The bump bond structures 110 include a barrier layer 114 on the copper pillars 112. The bump bond structures 110 further include solder 116 on the barrier layer 114. The solder 116 may include at least 50 weight percent tin. The solder 116 may optionally include other metals, such as silver, antimony, bismuth or copper. The barrier layer 114 includes cobalt, from 1 weight percent to 50 weight percent, which provides an effective reduction of tin-copper intermetallic compounds, and provides an effective reduction of copper and tin interdiffusion. A thickness of the barrier layer 114 is at least 1 micron, and may be as much as 5 microns. The barrier layer 114 includes an amount of zinc equivalent to a layer of pure thick zinc 0.05 microns to 0.5 microns. In other words, a product of the thickness of the barrier layer 114 and the weight percentage of the zinc may be 0.05 microns to 0.5 microns. This amount of zinc is effective to avoid formation of an undesired zinc oxide layer on a surface of the solder 116. The barrier layer 114 may include other metals, such as nickel, which reduce diffusion of copper and tin.

Figure 2A:
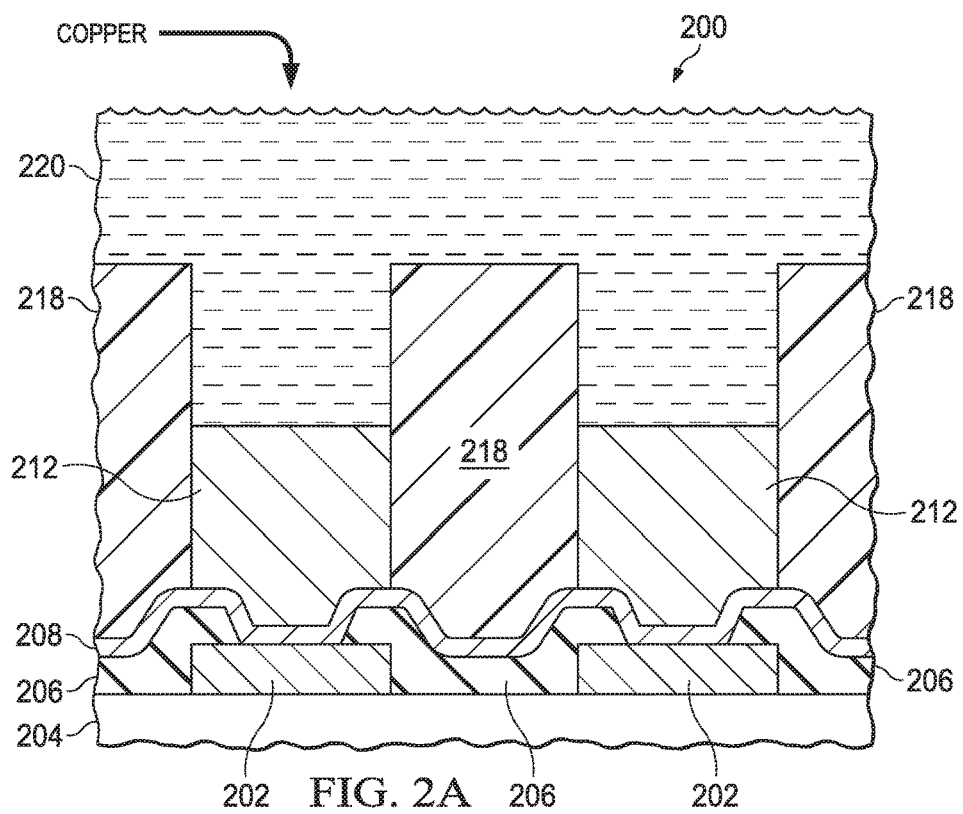
FIG. 2A through FIG. 2J are cross sections of a microelectronic device including bump bond structures having a barrier layer which includes cobalt and zinc, depicted in stages of an example method of formation.

FIG. 2A through FIG. 2J are cross sections of a microelectronic device including bump bond structures having a barrier layer which includes cobalt and zinc, depicted in stages of an example method of formation. Referring to FIG. 2A, the microelectronic device 200 has a substrate 204, which may be, for example, a portion of a semiconductor wafer, a MEMS substrate, or a multi-chip module substrate. The microelectronic device 200 includes I/O pads 202 on the substrate 204. The I/O pads 202 may include aluminum pads, formed by deposition of an aluminum layer, and patterned by a mask and etch process. The I/O pads 202 may include copper pads, formed by forming a mask and plate process. An optional PO layer 206 may be formed over the substrate 204. The PO layer 206, if formed, is patterned to have openings which expose at least portions of the I/O pads 202. The PO layer 206 may include the materials disclosed in reference to FIG. 1.

A seed layer 208 is formed over the substrate 204, on the PO layer 206 if present. The seed layer 208 contacts the I/O pads 202. The seed layer 208 may include the materials disclosed in reference to FIG. 1. The seed layer 208 may be formed by one or more sputter processes or evaporation processes, for example.

A plating mask 218 is formed over the seed layer 208. The plating mask 218 exposes areas on the seed layer 208 over the I/O pads 202. The plating mask 218 may include photoresist, and may be formed by a photolithographic process. Alternatively, the plating mask 218 may include organic polymer material, and may be formed by an additive process, such as binder jetting, material jetting, or material extrusion.

The seed layer 208 is exposed to a copper electroplating bath 220. A copper electroplating process using the copper electroplating bath 220 and the seed layer 208 forms copper pillars 212 on the seed layer 208 where exposed by the plating mask 218. The copper electroplating bath 220 includes copper, as indicated in FIG. 2A, for example in the form of copper sulfate, and may include additives such as levelers; suppressors, sometimes referred to as inhibitors; and accelerators, sometimes referred to as brighteners. The copper electroplating bath 220 may include other metals such as silver or nickel, to improve electrical or mechanical properties of the copper pillars 212.

Figure 2B:
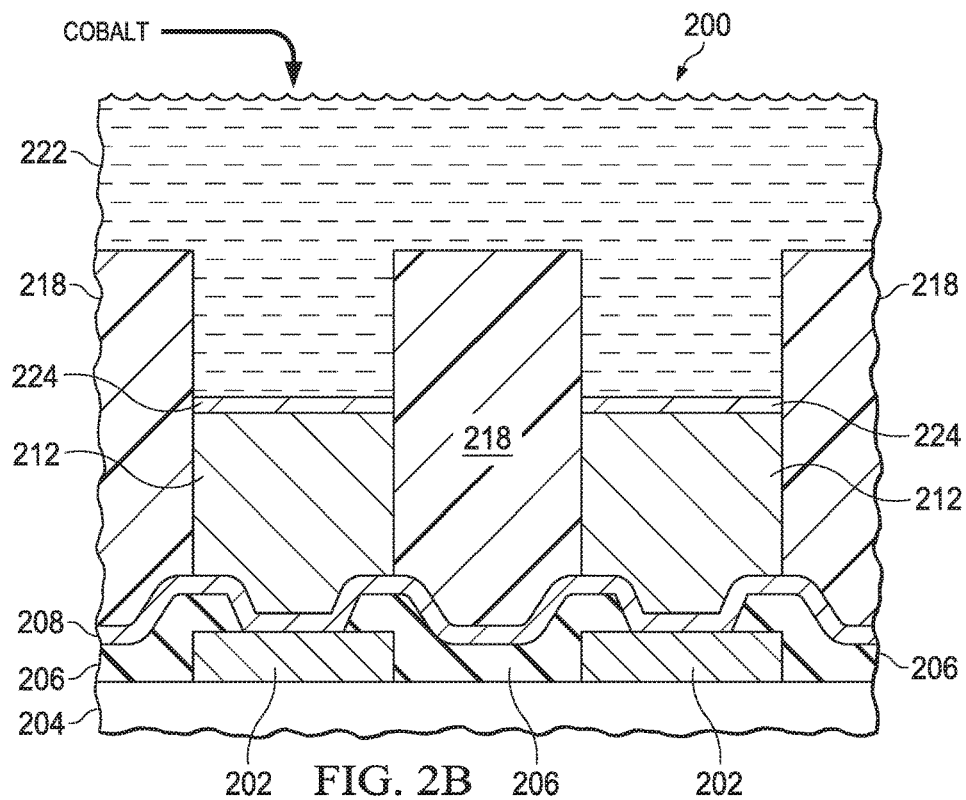

Referring to FIG. 2B, the plating mask 218 is left in place after the copper pillars 212 are formed. The copper pillars 212 are exposed to a cobalt electroplating bath 222. A cobalt electroplating process using the cobalt electroplating bath 222 and the seed layer 208 forms a cobalt-containing sublayer 224 on the copper pillars 212. The cobalt-containing sublayer 224 may have a thickness of 0.5 microns to 5 microns, for example. The cobalt electroplating bath 222 includes cobalt, as indicated in FIG. 2B, for example in the form of cobalt sulfate. The cobalt-containing sublayer 224 may include other metals, such as nickel, so that the cobalt-containing sublayer 224 includes the other metals. In one version of the instant example, the cobalt-containing sublayer 224 may be essentially free of zinc. In another version, the cobalt-containing sublayer 224 may optionally include zinc; in such a case, the cobalt-containing sublayer 224 includes more cobalt than zinc, that is, a weight percentage of cobalt in the cobalt-containing sublayer 224 is higher than a weight percentage of zinc in the cobalt-containing sublayer 224.

Figure 2C:
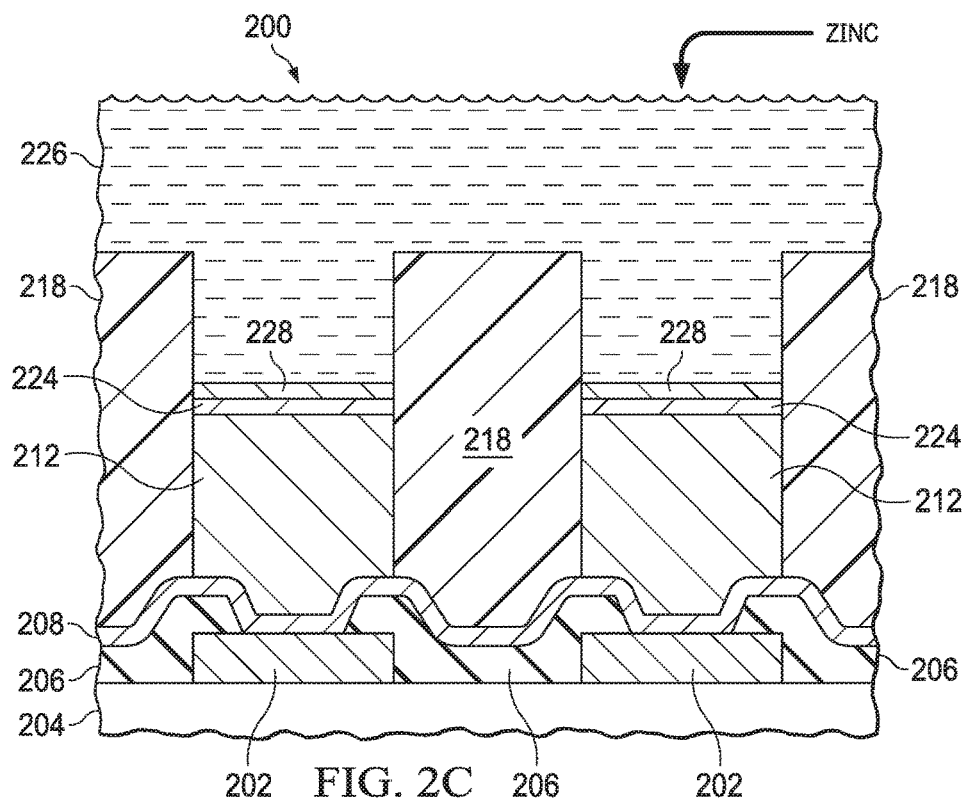

Referring to FIG. 2C, the plating mask 218 is left in place after the cobalt-containing sublayer 224 is formed. The cobalt-containing sublayer 224 is exposed to a zinc electroplating bath 226. A zinc electroplating process using the zinc electroplating bath 226 and the seed layer 208 formed a zinc-containing sublayer 228 on the cobalt-containing sublayer 224. The zinc-containing sublayer 228 includes primarily zinc, and may have a thickness of 0.05 microns to 0.5 microns, for example. The zinc-containing sublayer 228 includes an amount of zinc equivalent to a layer of pure zinc 0.05 microns to 0.5 microns thick. The zinc electroplating bath 226 includes zinc, as indicated in FIG. 2C, for example in the form of zinc sulfate.

Figure 2D:
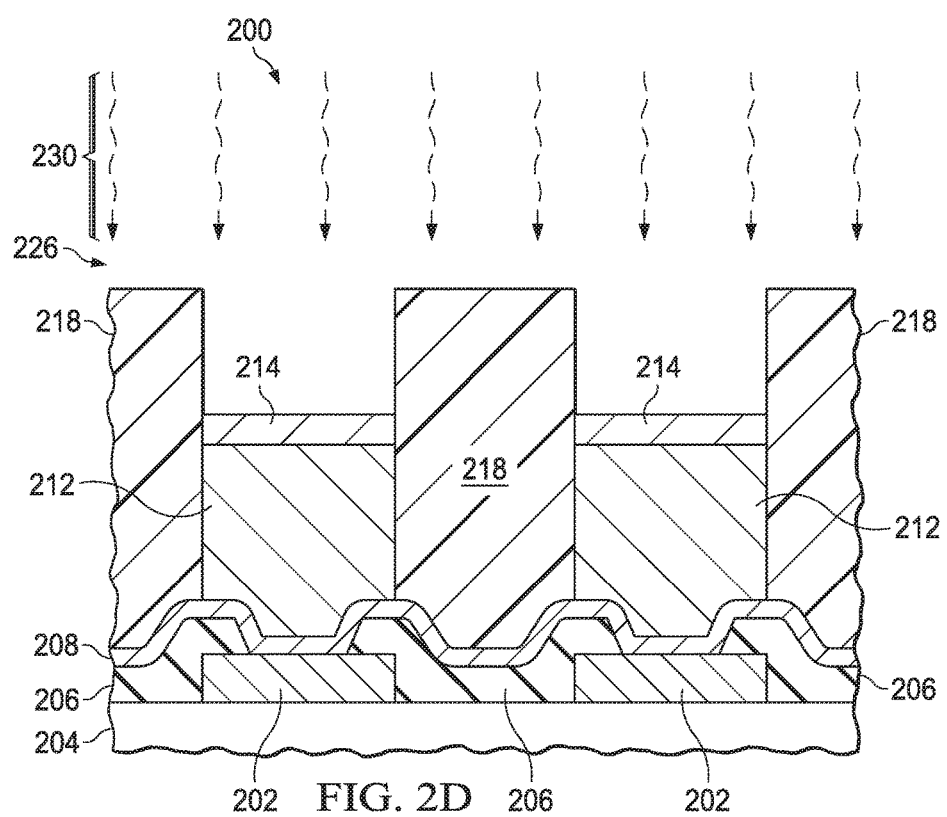

Referring to FIG. 2D, the cobalt-containing sublayer 224 and the zinc-containing sublayer 228 of FIG. 2C are heated to diffuse the cobalt in the cobalt-containing sublayer 224 and the zinc in the zinc-containing sublayer 228, to form a barrier layer 214 on the copper pillars 212. The cobalt-containing sublayer 224 and the zinc-containing sublayer 228 may be heated to 200° C. to 270° C. to form the barrier layer 214. The cobalt-containing sublayer 224 and the zinc-containing sublayer 228 may be heated by a first radiant heating process 230, as indicated in FIG. 2D. Alternatively, the cobalt-containing sublayer 224 and the zinc-containing sublayer 228 may be heated by a forced air heating process, a furnace heating process, or a hotplate heating process. The plating mask 218 may be left in place during formation of the barrier layer 214, as indicated in FIG. 2D.

Figure 2E:
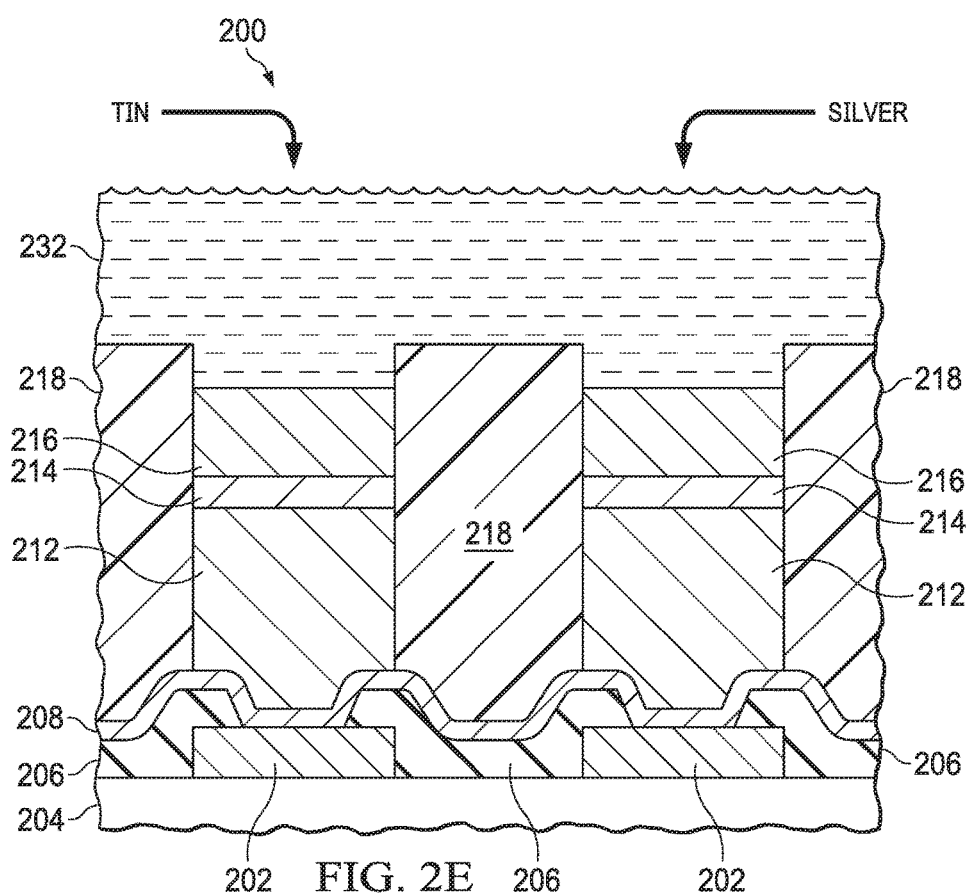

Referring to FIG. 2E, the barrier layer 214 is exposed to a solder electroplating bath 232. The solder electroplating bath 232 includes tin, as indicated in FIG. 2E, and may include other metals, such as silver. A solder electroplating process using the solder electroplating bath 232 and the seed layer 208 forms solder 216 on the barrier layer 214. The solder 216 includes primarily tin, that is more than 50 weight percent tin.

Figure 2F:
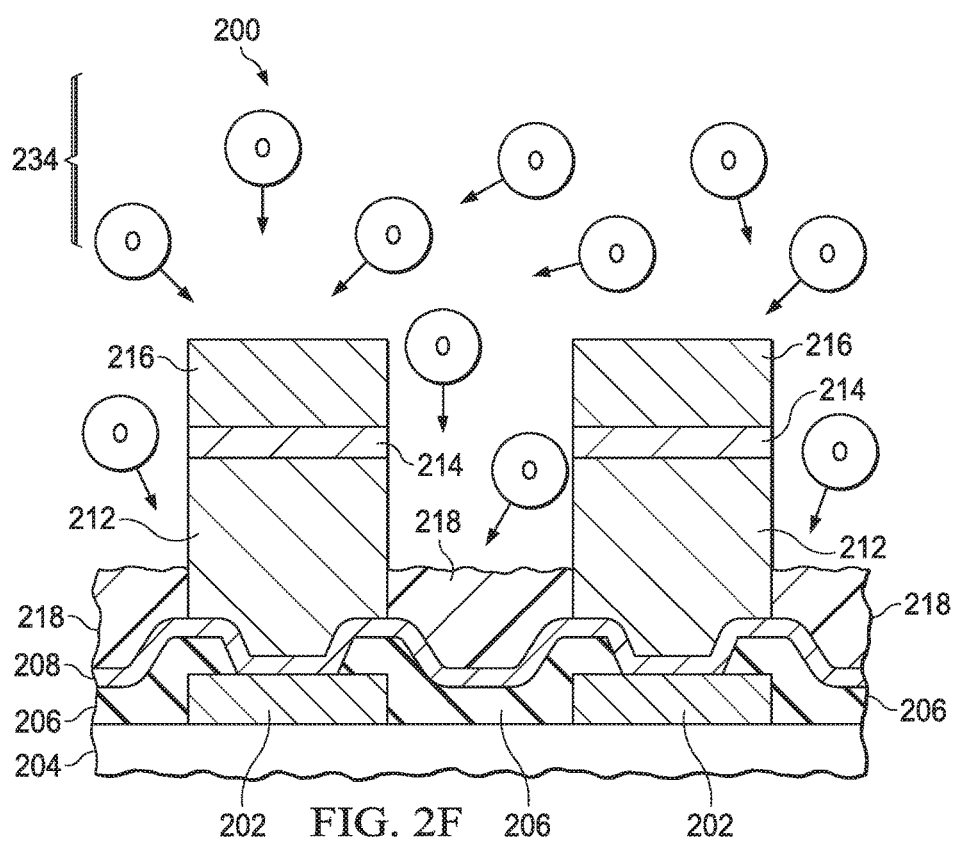

Referring to FIG. 2F, the plating mask 218 is removed. The plating mask 218 may be removed by a dry process using oxygen radicals 234 as indicated in FIG. 2F. The dry process may include a downstream asher process or an ozone process, for example. Alternatively, the plating mask 218 may be removed by a wet process using organic solvents, such as n-methyl pyrrolidone (NMP). FIG. 2F depicts removal of the plating mask 218 partway to completion.

Figure 2G:
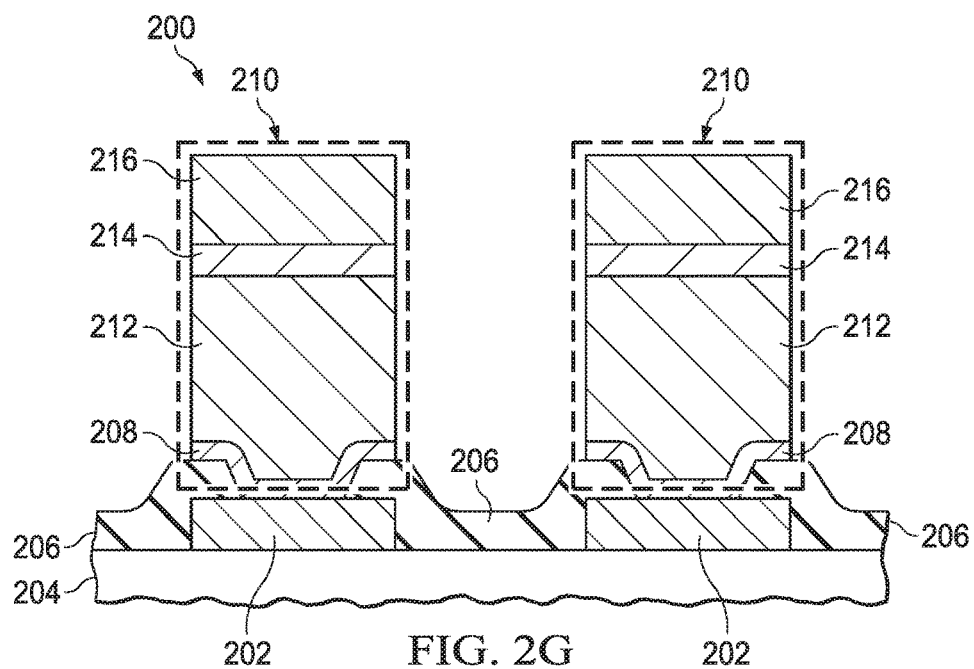

Referring to FIG. 2G, the seed layer 208 is removed where exposed by the copper pillars 212, leaving the seed layer 208 between the copper pillars 212 and the I/O pads 202. The seed layer 208 may be removed where exposed by the copper pillars 212 by a wet etch process, for example. The copper pillars 212, the barrier layer 214, and the solder 216 provide bump bond structures 210 on the I/O pads 202 through the seed layer 208.

Figure 2H:
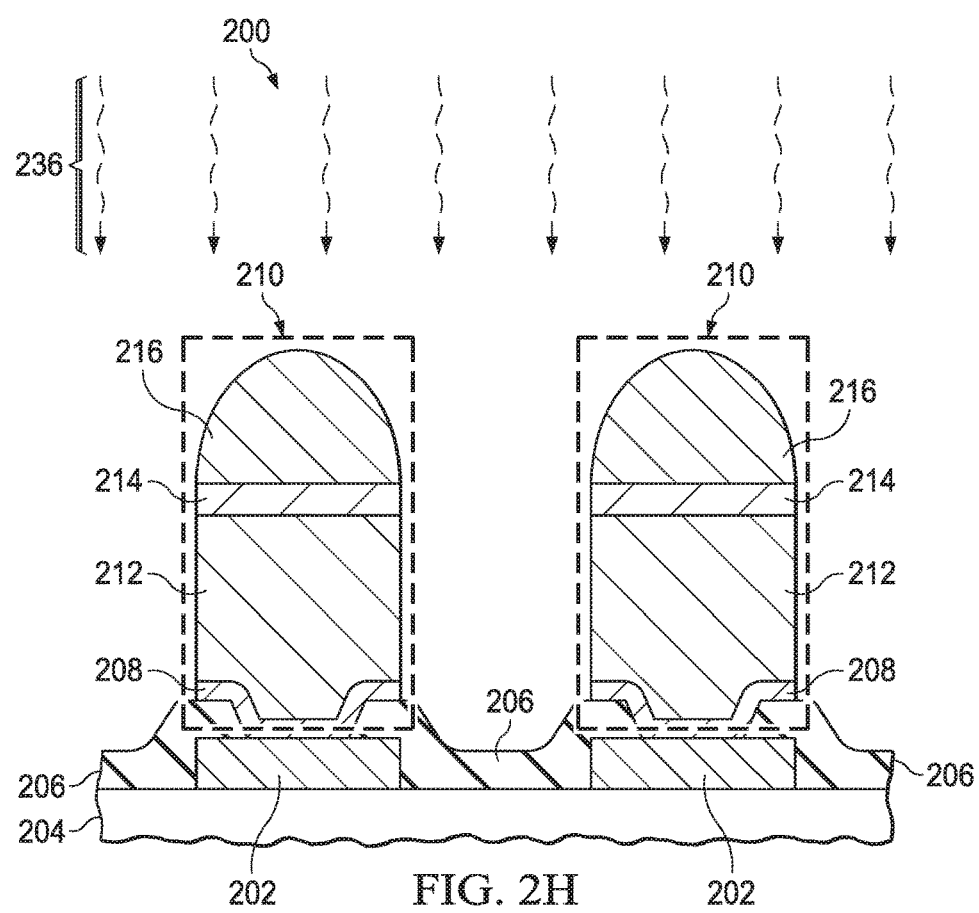

Referring to FIG. 2H, the solder 216 is heated to reflow the solder 216, producing a rounded top surface of the solder 216, and providing a low electrical resistance contact to the barrier layer 214. The top surface of the solder 216 is opposite from a boundary between the solder 216 and the barrier layer 214. The solder 216 may be heated by a second radiant heating process 236, as indicated in FIG. 2H. Alternatively, the solder 216 may be heated by a forced air heating process, a furnace heating process, or a hotplate heating process.

Figure 2I:
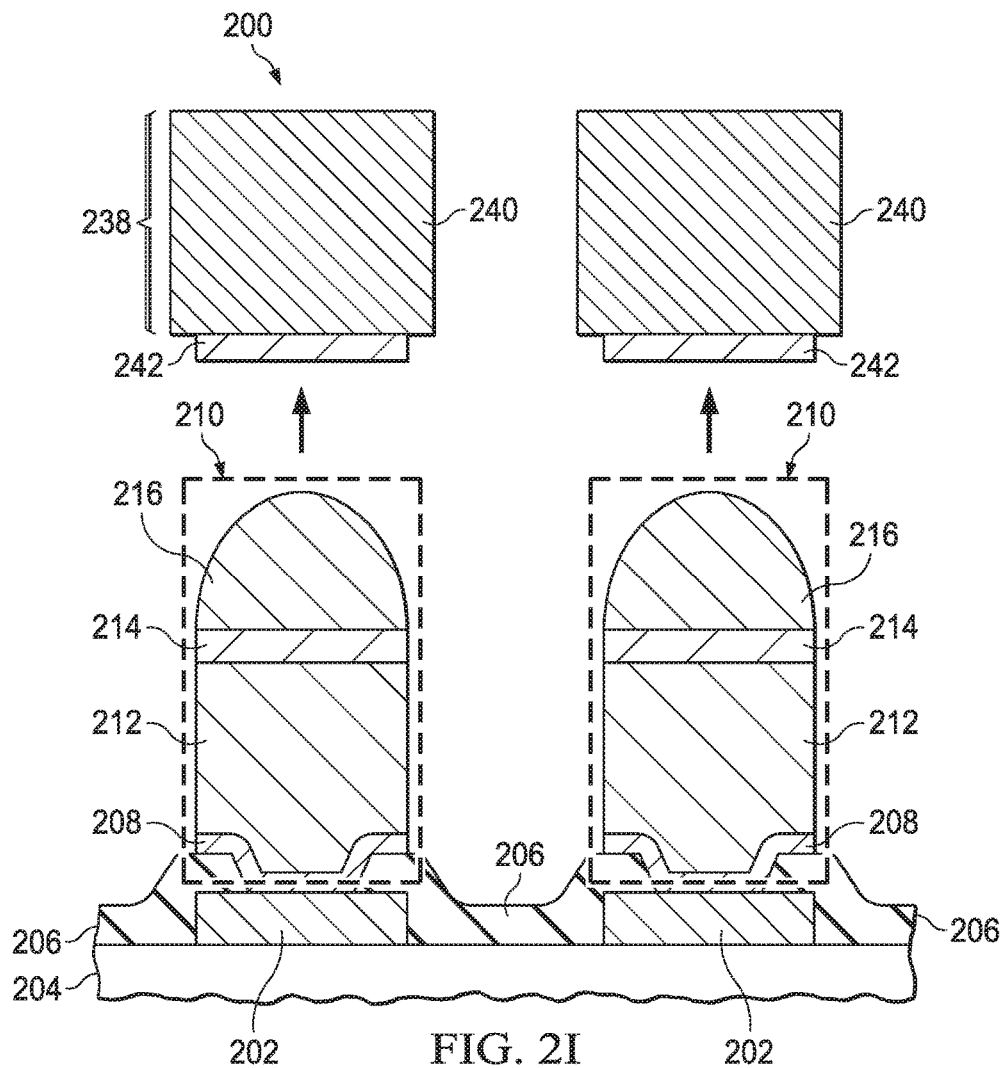

Referring to FIG. 2I, the microelectronic device 200 is assembled onto a package structure 238, which may be implemented as a lead frame 238, with leads 240. The leads 240 may be composed primarily of copper. The leads 240 may optionally have lead barrier layers 242 with similar compositions as the barrier layer 214 in the bump bond structures 210. The microelectronic device 200 is attached to the lead frame 238 by contacting the solder 216 of the bump bond structures 210 to the leads 240, through the lead barrier layers 242, if present.

Figure 2J:
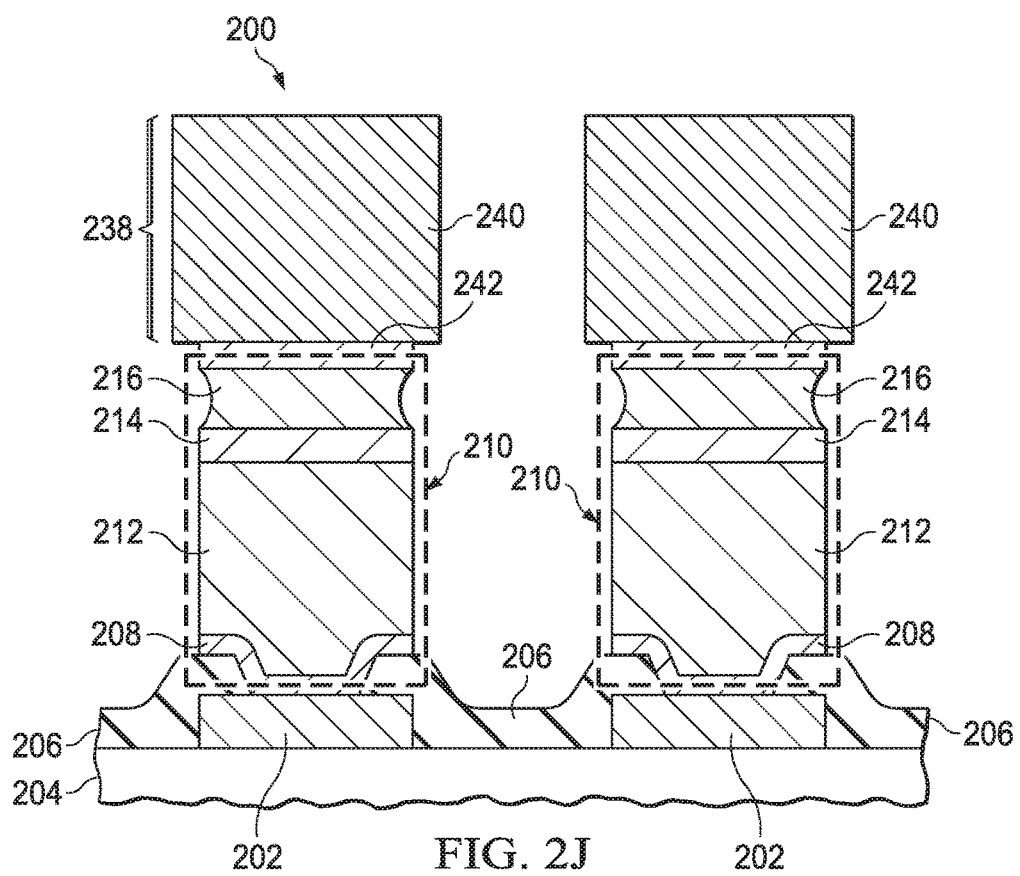

FIG. 2J depicts the microelectronic device 200 after being assembled onto the lead frame 238. The solder 216 is heated to reflow the solder 216, forming solder joints between the leads 240 and the copper pillars 212, through the barrier layer 214 and through the lead barrier layers 242, if present. The barrier layer 214 may reduce formation of voids in the copper pillars 212 and reduce formation of intermetallic compounds of copper from the copper pillars 212 and tin from the solder 216, thus advantageously improving reliability of the microelectronic device 200. Similarly, the lead barrier layers 242 may reduce formation of voids in the leads 240 and reduce formation of intermetallic compounds of copper from the leads 240 and tin from the solder 216, accruing a similar advantage of improved reliability.

Figure 3A:
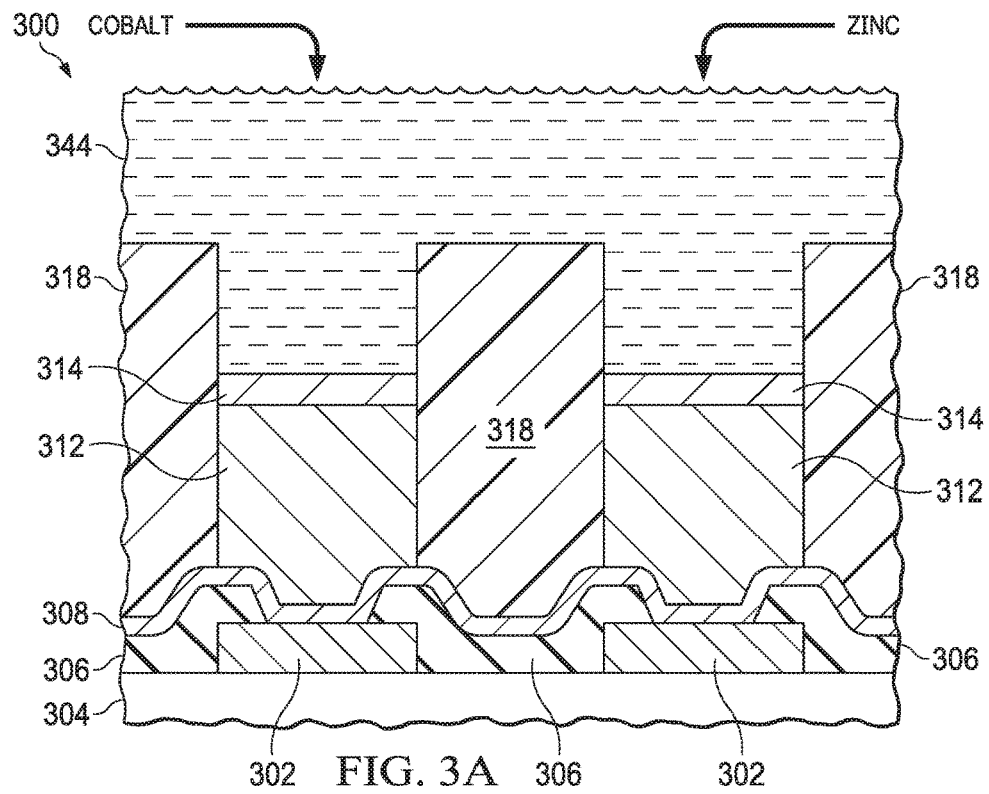
FIG. 3A and FIG. 3B are cross sections of a microelectronic device including bump bond structures having a barrier layer which includes cobalt and zinc, depicted in stages of another example method of formation.
Figure 3B:
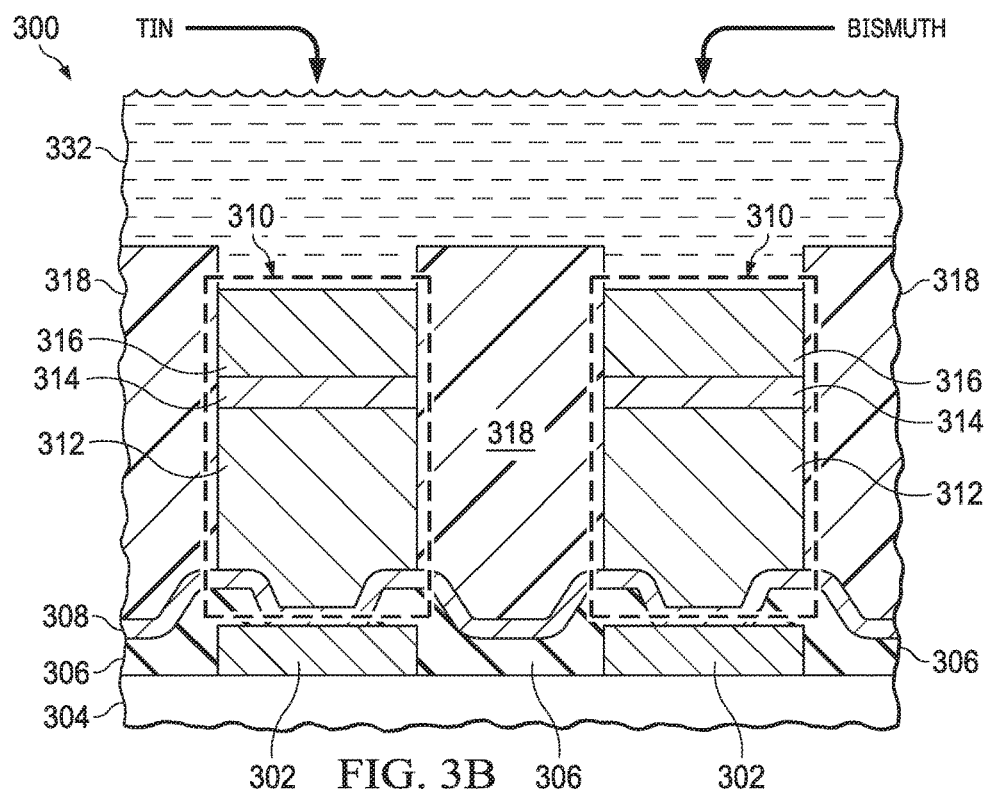

FIG. 3A and FIG. 3B are cross sections of a microelectronic device including bump bond structures having a barrier layer which includes cobalt and zinc, depicted in stages of another example method of formation. Referring to FIG. 3A, the microelectronic device 300 has a substrate 304, which may be implemented as disclosed in reference to FIG. 1. The microelectronic device 300 includes I/O pads 302 on the substrate 304. The I/O pads 302 may have the structure and composition disclosed in reference to FIG. 1, and may be formed as disclosed in reference to FIG. 2A. An optional PO layer 306 may be formed over the substrate 304 with openings which expose at least portions of the I/O pads 302.

A seed layer 308 is formed over the substrate 304, contacting the I/O pads 302. The seed layer 308 may include the materials disclosed in reference to FIG. 1, and may be formed as disclosed in reference to FIG. 2A. A plating mask 318 is formed over the seed layer 308. The plating mask 318 exposes areas on the seed layer 308 over the I/O pads 302. The plating mask 318 may be formed as disclosed in reference to FIG. 2A. Copper pillars 312 are formed on the seed layer 308 where exposed by the plating mask 318. The copper pillars 312 may be formed by a copper electroplating process, for example as disclosed in reference to FIG. 2A.

The copper pillars 312 are exposed to a barrier electroplating bath 344. The barrier electroplating bath 344 includes cobalt and zinc, as indicated in FIG. 3A. The cobalt may be added to the barrier electroplating bath 344 in the form of cobalt sulfate. The zinc may be added to the barrier electroplating bath 344 in the form of zinc sulfate. A barrier electroplating process using the barrier electroplating bath 344 and the seed layer 308 forms a barrier layer 314 on the copper pillars 312 by electroplating cobalt and zinc concurrently onto the copper pillars 312. The barrier layer 314 includes cobalt and zinc, and has the properties disclosed in reference to FIG. 1. A concentration of the cobalt in the barrier electroplating bath 344 may be higher than a concentration of the zinc in the barrier electroplating bath 344, to obtain a desired ratio of cobalt to zinc in the barrier layer 314. The barrier electroplating process may also use a reverse pulse plating process to obtain the desired ratio of cobalt to zinc in the barrier layer 314. The reverse pulse plating process is explained in reference to FIG. 4 below. The barrier layer 314 may optionally be heated, for example at 200° C. to 270° C., to improve contact between the barrier layer 314 and the copper pillars 312.

Referring to FIG. 3B, the barrier layer 314 is exposed to a solder electroplating bath 332. The solder electroplating bath 332 includes tin, as indicated in FIG. 3B, and may include other metals, such as bismuth, as indicated in FIG. 3B, or silver. A solder electroplating process using the solder electroplating bath 332 and the seed layer 308 forms solder 316 on the barrier layer 314. The solder 316 includes primarily tin.

Subsequently, the plating mask 318 is removed. The seed layer 308 is removed where exposed by the copper pillars 312, leaving the seed layer 308 between the copper pillars 312 and the I/O pads 302. The copper pillars 312, the barrier layer 314, and the solder 316 provide bump bond structures 310 on the I/O pads 302 through the seed layer 308. The solder 316 may be heated to reflow the solder 316, as disclosed in reference to FIG. 2H.

Figure 4:
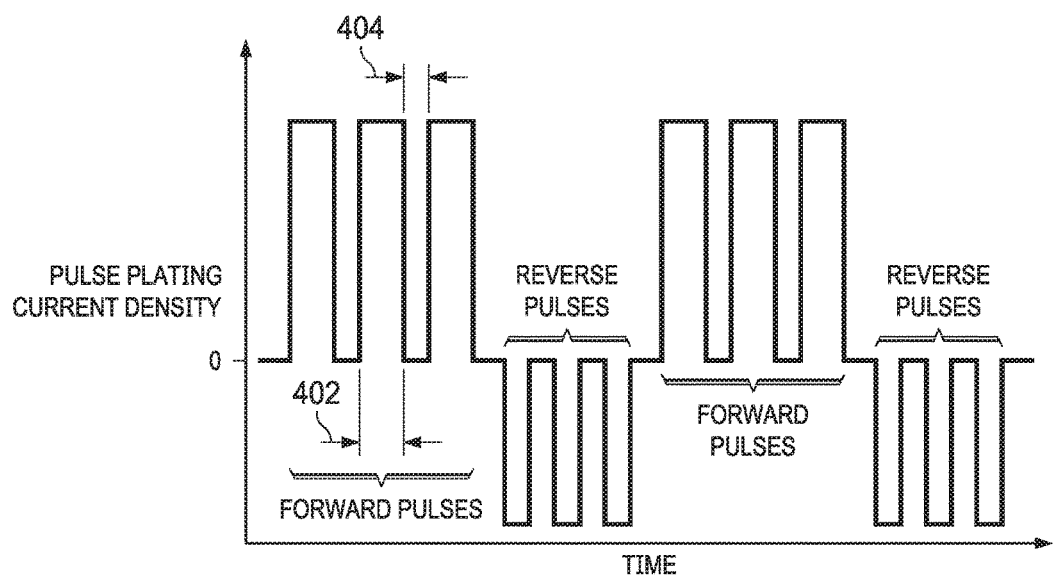
FIG. 4 depicts an example reverse pulse plating waveform.

FIG. 4 depicts an example reverse pulse plating waveform. The waveform depicts current density on the vertical axis as a function of time on the horizontal axis. In this example waveform, three forward pulses are applied, followed by three reverse pulses. Zinc electroplates more readily than cobalt from the barrier electroplating bath (344) onto the copper pillars (312) of FIG. 3A, that is, at a lower forward voltage between the barrier electroplating bath (344) and the copper pillars (312). A forward current density of the forward pulses may have a sufficient amplitude to provide a sufficiently high forward voltage between the barrier electroplating bath (344) and the copper pillars (312) to plate both the cobalt ions and the zinc ions in the barrier electroplating bath (344) proximate to the copper pillars (312), to attain desired concentrations of cobalt and zinc in the barrier layer 314 of FIG. 3A. During the forward pulses, concentrations of the cobalt ions and the zinc ions in the barrier electroplating bath (344) proximate to the copper pillars (312) may be depleted, as a result of the high forward current density. The forward pulses have a short time duration, referred to herein as the forward on time 402, to avoid hydrogen generation as the cobalt ions and the zinc ions are depleted. The forward pulses are separated by periods of time with substantially no current, referred to herein as the forward off time 404, which is sufficiently long to allow diffusion of the cobalt ions and zinc ions to diffuse proximate to the copper pillars (312) from a remaining volume of the barrier electroplating bath (344). The values of the forward on time 402 and the forward off time 404 may be in a range of 1 millisecond to 1 second, and may depend on the average concentrations of the cobalt ions and zinc ions in the barrier electroplating bath (344).

A reverse current density of the reverse pulses may be adjusted to provide a higher concentration of the cobalt in the barrier layer 314 than can be easily attained using forward pulses alone. The reverse pulses may remove a portion of the cobalt and zinc, in a different ratio than was plated during the forward pulses. A combination of the forward pulses followed by the reverse pulses is repeated one or more times to form the barrier layer 314 with a desired thickness.

Figure 5:
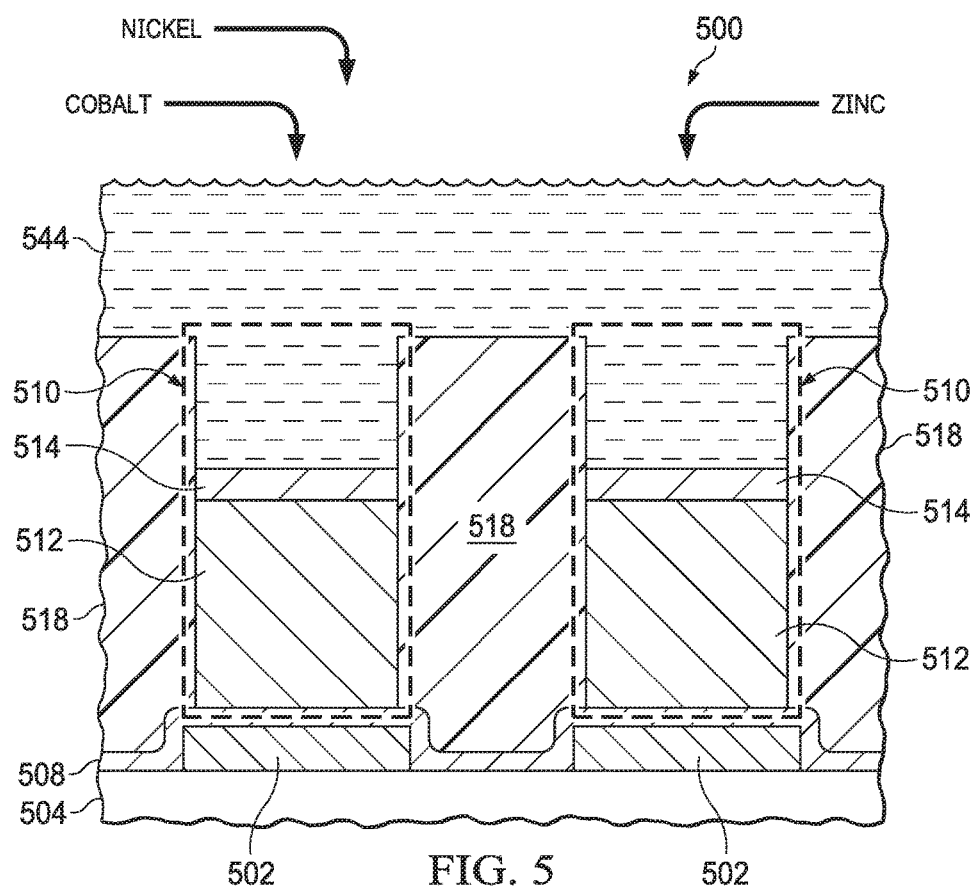
FIG. 5 is a cross section of a microelectronic device including bump bond structures having a barrier layer which includes cobalt, nickel, and zinc, depicted in a further example method of formation.

FIG. 5 is a cross section of a microelectronic device including bump bond structures having a barrier layer which includes cobalt, nickel, and zinc, depicted in a further example method of formation. The microelectronic device 500 has a substrate 504, for example, as disclosed in reference to FIG. 1, with I/O pads 502, for example, as disclosed in reference to FIG. 1 and FIG. 2A, on the substrate 504. In the instant example, the microelectronic device 500 may be free of a PO layer over the substrate 504, as depicted in FIG. 5.

A seed layer 508, for example, as disclosed in reference to FIG. 1 and FIG. 2A, is formed over the substrate 504, contacting the I/O pads 502. A plating mask 518, for example, as disclosed in reference to FIG. 2A, is formed over the seed layer 508, which exposes areas on the seed layer 508 over the I/O pads 502. Copper pillars 512 are formed on the seed layer 508 where exposed by the plating mask 518. The copper pillars 512 may be formed by a copper electroplating process, for example as disclosed in reference to FIG. 2A.

The copper pillars 512 are exposed to a barrier electroplating bath 544. The barrier electroplating bath 544 of the instant example includes cobalt, nickel, and zinc, as indicated in FIG. 5. The cobalt, nickel, and zinc may be added to the barrier electroplating bath 544 in the form of cobalt sulfate, nickel sulfate, and zinc sulfate, respectively. A barrier electroplating process using the barrier electroplating bath 544 and the seed layer 508 forms a barrier layer 514 on the copper pillars 512 by electroplating the cobalt, the nickel, and the zinc concurrently from the barrier electroplating bath 544 onto the copper pillars 512. The barrier layer 514 includes cobalt, nickel, and zinc, and has the properties disclosed in reference to FIG. 1. Concentrations of the cobalt, nickel, and zinc in the barrier electroplating bath 544 may be adjusted to provide desired weight percentages of cobalt, nickel, and zinc in the barrier layer 514. The barrier electroplating process may also use a reverse pulse plating process to obtain the desired weight percentages of cobalt, nickel, and zinc. The barrier layer 514 may optionally be heated, for example at 200° C. to 270° C., to improve contact between the barrier layer 514 and the copper pillars 512.

Solder, containing primarily tin, not shown in FIG. 5, is subsequently formed on the barrier layer 514. The plating mask 518 is removed. The seed layer 508 is removed where exposed by the copper pillars 512, leaving the seed layer 508 between the copper pillars 512 and the I/O pads 502. The copper pillars 512, the barrier layer 514, and the solder provide bump bond structures 510 on the I/O pads 502 through the seed layer 508. The nickel in the barrier layer 514 may reduce diffusion of copper from the copper pillars 512 into the solder, and may be less expensive than the cobalt, advantageously reducing a cost of the microelectronic device 500 compared to having a barrier layer with cobalt and zinc, and free of nickel.

Figure 6A:
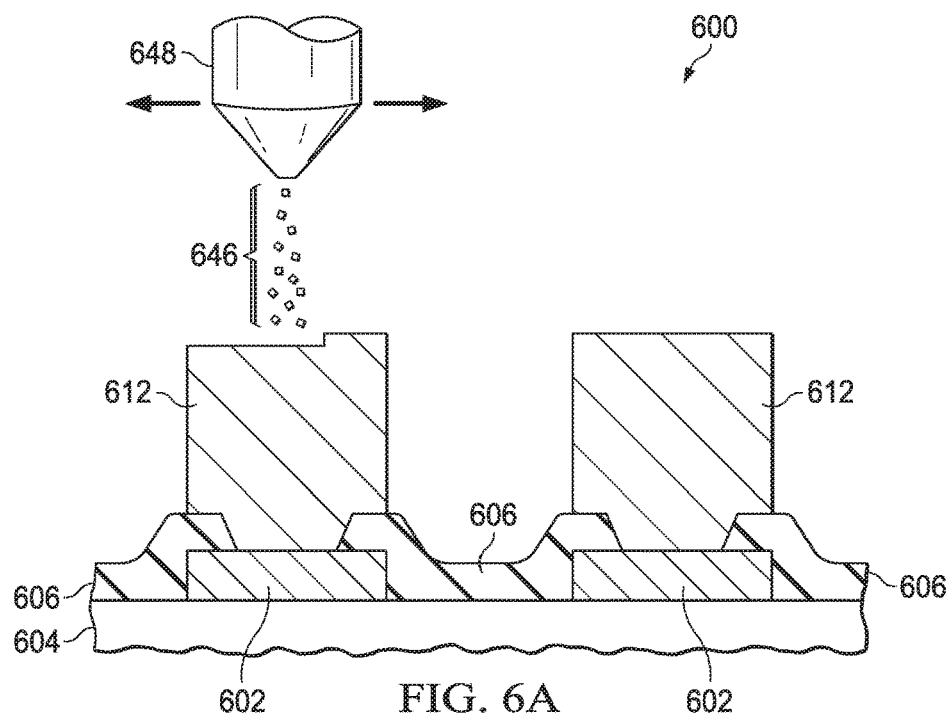
FIG. 6A through FIG. 6D are cross sections of a microelectronic device including bump bond structures having a barrier layer which includes cobalt and zinc, depicted in stages of another example method of formation.

FIG. 6A through FIG. 6D are cross sections of a microelectronic device including bump bond structures having a barrier layer which includes cobalt and zinc, depicted in stages of another example method of formation. Referring to FIG. 6A, the microelectronic device 600 has a substrate 604, for example, as disclosed in reference to FIG. 1, with I/O pads 602, for example, as disclosed in reference to FIG. 1 and FIG. 2A, on the substrate 604. An optional PO layer 606, for example, as disclosed in reference to FIG. 1 and FIG. 2A, may be formed over the substrate 604 with openings which expose at least portions of the I/O pads 602.

Copper pillars 612 are formed directly on the I/O pads 602 by a first additive process. For the purposes of this disclosure, an additive process may be understood to dispose pillar material 646, such as copper-containing nanoparticles, for the copper pillars 612 in desired areas and not dispose the pillar material 646 outside of the desired areas, so that it is not necessary to remove a portion of the disposed pillar material 646 to produce a final desired shape of the copper pillars 612. Additive processes may enable forming the copper pillars 612 without seed layers, plating masks, and subsequent removal processes, thus advantageously reducing fabrication cost and complexity. Examples of additive processes include binder jetting, material jetting, directed energy deposition, material extrusion, powder bed fusion, sheet lamination, vat photopolymerization, direct laser deposition, electrostatic deposition, laser sintering, electrochemical deposition, and photo-polymerization extrusion. FIG. 6A depicts the first additive process as an electrostatic deposition process using an electrostatic deposition apparatus 648. The copper pillars 612 may optionally be heated, to remove volatile material, to sinter copper-containing nanoparticles, or to alloy metal constituents of the copper pillars 612.

Figure 6B:
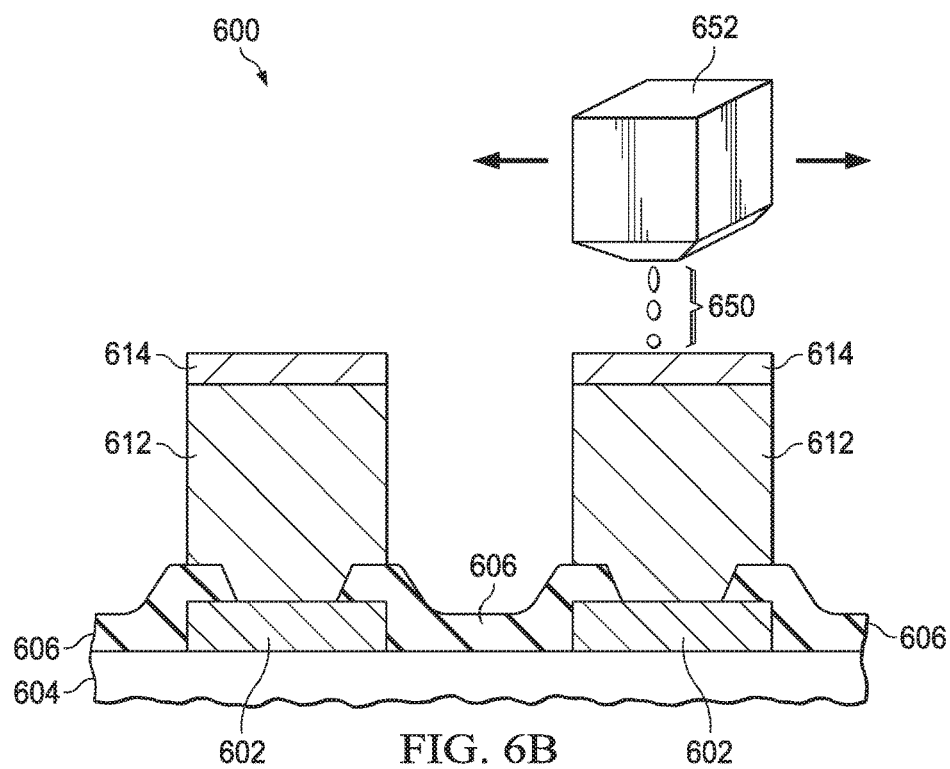

Referring to FIG. 6B, a barrier layer 614 is formed on the copper pillars 612 by a second additive process which dispenses barrier material 650 onto the copper pillars 612. FIG. 6B depicts the second additive process as a material jetting process in which the barrier material 650 is implemented as barrier ink 650. The barrier ink 650 includes cobalt and zinc, for example, in the form of cobalt nanoparticles and zinc nanoparticles. The barrier ink 650 may include a carrier fluid to facilitate dispensing the cobalt nanoparticles and zinc nanoparticles. The material jetting process may dispense the barrier ink 650 using a material jetting apparatus 652, sometimes referred to as an ink jet apparatus. Alternatively, the second additive process may be implemented as any of the additive processes disclosed in reference to FIG. 6A, or any other additive process. The relative proportions of the cobalt nanoparticles and zinc nanoparticles in the barrier ink 650 may be selected to provide a desired ratio of cobalt to zinc in the barrier layer 614. Using the second additive process may enable forming the barrier layer 614 with a higher concentration of cobalt than is easily achieved by electroplating, which may advantageously provide a thinner barrier layer 614 compared to a similar barrier layer with a lower concentration of cobalt.

Figure 6C:
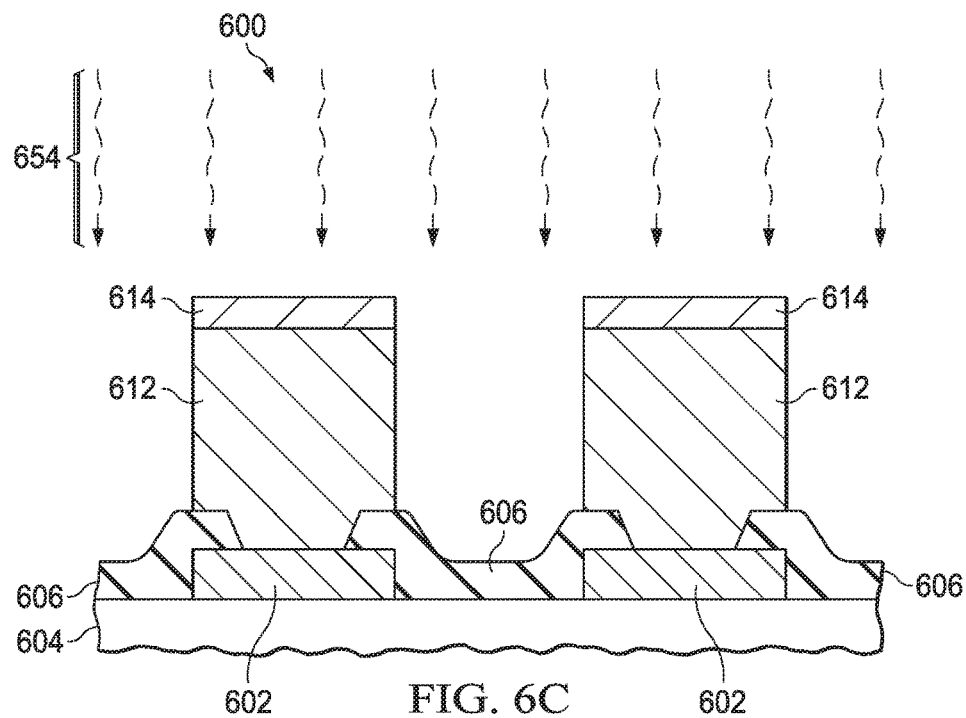

Referring to FIG. 6C, the barrier layer 614 may optionally be heated, to remove volatile material, or to alloy the cobalt nanoparticles and zinc nanoparticles. The barrier layer 614 may be heated by a radiant heating process 654, as indicated in FIG. 6C. Alternatively, the barrier layer 614 may be heated by a forced air heating process, a furnace heating process, or a hotplate heating process. Alloying the cobalt nanoparticles and zinc nanoparticles may be accomplished at a low temperature, for example around 200° C., advantageously reducing degradation of the microelectronic device 600.

Figure 6D:
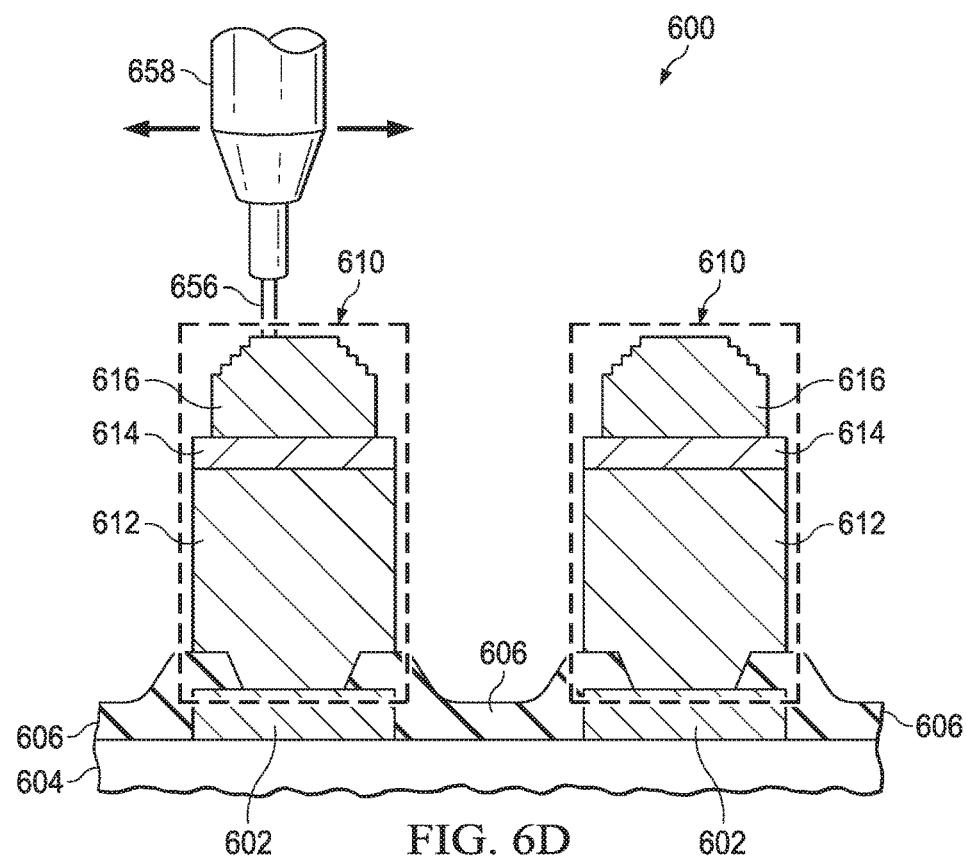

Referring to FIG. 6D, solder 616 is formed on the barrier layer 614 by a third additive process. FIG. 6D depicts the third additive process as a material extrusion process which dispenses solder paste 656 onto the barrier layer 614. The solder paste 656 includes tin and may include flux, solvents, surfactants, or other materials to facilitate the third additive process. The material extrusion process may dispense the solder paste 656 using a material extrusion apparatus 658, which may be implemented as continuous material extrusion apparatus 658, as indicated in FIG. 6D. Alternatively, the third additive process may be implemented as any of the additive processes disclosed in reference to FIG. 6A, or any other additive process.

The solder 616 may be subsequently heated to remove volatile material from the solder 616, and reflow the solder 616 to improve contact to the barrier layer 614. The solder 616 after heating includes primarily tin, that is, at least 50 weight percent tin.

The copper pillars 612, the barrier layer 614, and the solder 616 provide bump bond structures 610 directly on the I/O pads 602. Forming the copper pillars 612, the barrier layer 614, and the solder 616 using the first, second, and third additive processes eliminates need for a seed layer and a plating mask, thus advantageously reduces fabrication complexity.

Figure 7A:
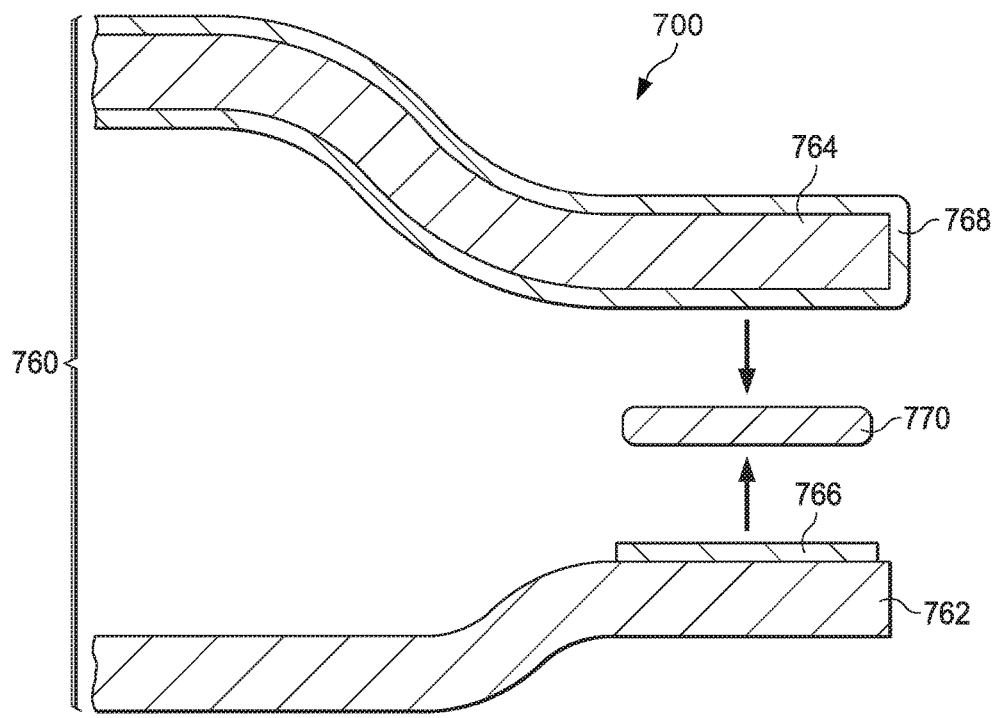
FIG. 7A and FIG. 7B are cross sections of a lead frame including solder structures having a barrier layer which includes cobalt and zinc, depicted in stages of another example method of formation.
Figure 7B:
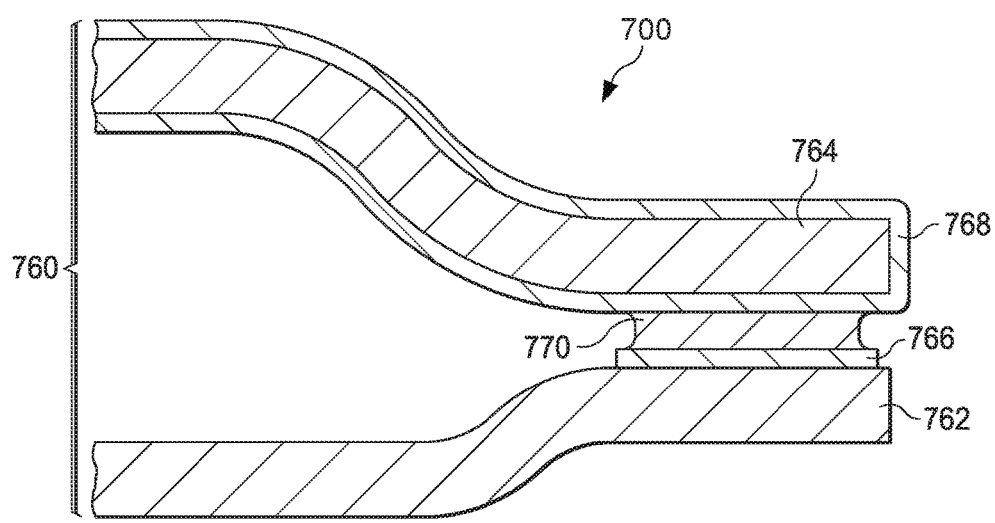

FIG. 7A and FIG. 7B are cross sections of microelectronic device which includes a lead frame including solder structures having a barrier layer which includes cobalt and zinc, depicted in stages of another example method of formation. Referring to FIG. 7A, the microelectronic device 700 has a lead frame 760 which includes a first copper-containing member 762, which may be implemented as a die pad 762, and an electrically conductive member 764, for example, a second copper-containing member 764, which may be implemented as a clip 764. The die pad 762 includes primarily copper, and the clip 764 may include primarily copper, and may each include more than 90 weight percent copper, for example.

The die pad 762 may have a first barrier layer 766 on a surface of the die pad 762 in an area for a subsequent solder attachment to the clip 764. The first barrier layer 766 has the properties disclosed in reference to the barrier layer 114 of FIG. 1. In the instant example, the first barrier layer 766 may be localized to the area for solder attachment of the clip 764, as depicted in FIG. 7A.

The clip 764 may have a second barrier layer 768 on a surface of the clip 764 in an area for the solder attachment to the die pad 762. The second barrier layer 768 also has the properties disclosed in reference to the barrier layer 114 of FIG. 1. In the instant example, the second barrier layer 768 may extend significantly past the area for solder attachment to the die pad 762, for example, completely over the surface of the clip 764, as depicted in FIG. 7A.

The clip 764 is attached to the die pad 762 using solder 770, which may be implemented as a solder insert or solder paste, for example. The clip 764 is attached to the die pad 762 by bringing the clip 764 and the die pad 762 into contact with the solder 770 on opposite sides of the solder 770. The clip 764, the solder 770, and the die pad 762 are heated to reflow the solder 770, forming a solder joint connecting the clip 764 to the die pad 762 through the first barrier layer 766 and the second barrier layer 768.

FIG. 7B depicts the lead frame 760 after the clip 764 is attached to the die pad 762. The first barrier layer 766 may reduce diffusion copper from the die pad 762 and may thus reduce formation of tin-copper intermetallic compounds, advantageously improving reliability of the lead frame 760. Similarly, the second barrier layer 768 may reduce diffusion copper from the clip 764 and may thus further improve the reliability of the lead frame 760.

Various features of the examples disclosed herein may be combined in other manifestations of example microelectronic devices. For example, the barrier layer 114 of FIG. 1 may be formed by any of the methods disclosed in reference to FIG. 2B through FIG. 2D, FIG. 3A, FIG. 4, FIG. 5, or FIG. 6B. The copper pillars 112 of FIG. 1 may be formed by any of the methods disclosed in reference to FIG. 2A or FIG. 6A. The solder 116 of FIG. 1 may be formed by any of the methods disclosed in reference to FIG. 2E, FIG. 3B, or FIG. 6D.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present invention should not be limited by any of the above described examples. Rather, the scope of the disclosure should be defined in accordance with the following claims and their equivalents.

What is claimed is:
1. A microelectronic device, comprising:
    an input/output (I/O) pad;
    a bump bond structure electrically coupled to the I/O pad, the bump bond structure including:
        a copper-containing pillar, the copper-containing pillar including at least 90 weight percent copper;
        a barrier layer on at least a portion of the copper-containing pillar, the barrier layer including 0.1 weight percent to 50 weight percent cobalt, the barrier layer including an amount of zinc equivalent to a layer of pure zinc 0.05 microns to 0.5 microns thick; and
        solder on the barrier layer.
2. The microelectronic device of claim 1, wherein the solder includes at least 50 weight percent tin.
3. The microelectronic device of claim 1, wherein the barrier layer includes nickel, wherein a weight percentage of the nickel is less than the weight percentage of the cobalt.
4. The microelectronic device of claim 1, wherein the barrier layer is 1 micron to 5 microns thick.
5. The microelectronic device of claim 1, wherein a product of a thickness of the barrier layer and a weight percentage of the zinc is 0.05 microns to 0.5 microns.
6. The microelectronic device of claim 1, further including a seed layer between the copper-containing pillar and the I/O pad, the seed layer including an electrically conductive material.

7. The microelectronic device of claim 1, wherein the bump bond structure is attached to a package structure through a solder joint, the solder joint including the solder.

8. A method of forming a microelectronic device, comprising:
   providing a substrate having an input/output (I/O) pad;
   forming a copper-containing pillar, so that the copper-containing pillar includes at least 90 weight percent copper;
   forming a barrier layer on the copper-containing pillar, so that the barrier layer includes 0.1 weight percent to 50 weight percent cobalt, and so that the barrier layer includes an amount of zinc equivalent to a layer of pure zinc 0.05 microns to 0.5 microns thick; and
   forming solder on the barrier layer, so that the solder includes tin.

9. The method of claim 8, wherein forming the barrier layer includes:
   electroplating a cobalt-containing sublayer on the copper-containing pillar, so that a weight percentage of cobalt in the cobalt-containing sublayer is higher than a weight percentage of zinc in the cobalt-containing sublayer; and
   electroplating a zinc-containing sublayer on the cobalt-containing sublayer, so that the zinc-containing sublayer includes an amount of zinc equivalent to a layer of pure zinc 0.05 microns to 0.5 microns thick.

10. The method of claim 9, further including heating the cobalt-containing sublayer and the zinc-containing sublayer to 200° C. to 270° C. to form the barrier layer.

11. The method of claim 9, wherein forming the barrier layer further includes electroplating nickel.

12. The method of claim 8, wherein forming the barrier layer includes exposing the copper-containing pillar to a barrier electroplating bath, the barrier electroplating bath including cobalt and zinc, and electroplating the cobalt and the zinc concurrently from the barrier electroplating bath onto the copper pillar.

13. The method of claim 12, wherein electroplating the cobalt and the zinc is performed using a reverse pulse plating process.

14. The method of claim 12, wherein the barrier electroplating bath includes nickel, and forming the barrier layer includes electroplating nickel concurrently with the cobalt and the zinc.

15. The method of claim 8, wherein forming the barrier layer includes an additive process which dispenses barrier material onto the copper pillars, the barrier material including cobalt and zinc.

16. A microelectronic device, comprising:
   a lead frame, the lead frame including a copper-containing member, and a first barrier layer on a first surface of the copper-containing member, the first barrier layer including 0.1 weight percent to 50 weight percent cobalt, the first barrier layer including an amount of zinc equivalent to a layer of pure zinc 0.05 microns to 0.5 microns thick;
   an electrically conductive member; and
   a solder joint connecting the copper-containing member to the electrically conductive member through the first barrier layer, the solder joint including solder.

17. The lead frame of claim 16, wherein the electrically conductive member includes copper, and further comprising a second barrier layer on a second surface of the electrically conductive member, the second barrier layer including 0.1 weight percent to 50 weight percent cobalt, the second barrier layer including an amount of zinc equivalent to a layer of pure zinc 0.05 microns to 0.5 microns thick, wherein the solder joint connects the copper-containing member to the electrically conductive member through the second barrier layer.

18. The lead frame of claim 16, wherein the first barrier layer is 1 micron to 5 microns thick.

19. The lead frame of claim 16, wherein a product of a thickness of the first barrier layer and a weight percentage of the zinc is 0.05 microns to 0.5 microns.

20. The lead frame of claim 16, wherein the first barrier layer includes nickel, wherein a weight percentage of the nickel is less than the weight percentage of the cobalt.

* * * * *